(12) United States Patent
Holmes et al.

(10) Patent No.: US 11,985,785 B2
(45) Date of Patent: May 14, 2024

(54) MECHANISMS AND METHODS FOR TWO-SIDED RACK ACCESS

(71) Applicant: DELL PRODUCTS L.P., Round Rock, TX (US)

(72) Inventors: Bruce Holmes, Austin, TX (US); Maunish Shah, Austin, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 0 days.

(21) Appl. No.: 17/154,931

(22) Filed: Jan. 21, 2021

(65) Prior Publication Data
US 2022/0232725 A1 Jul. 21, 2022

(51) Int. Cl.
H05K 7/14 (2006.01)
H05K 7/18 (2006.01)
G06F 1/18 (2006.01)

(52) U.S. Cl.
CPC .......... *H05K 7/1489* (2013.01); *H05K 7/183* (2013.01); *G06F 1/183* (2013.01)

(58) Field of Classification Search
CPC ...... H05K 7/1489; H05K 7/183; G06F 1/183; A47B 88/43; A47B 88/403; A47B 88/477; A27B 2210/0059
See application file for complete search history.

(56) References Cited

U.S. PATENT DOCUMENTS

| | | | | |
|---|---|---|---|---|
| 5,851,059 A * | 12/1998 | Cirocco | ............... | A47B 88/493 312/334.8 |
| 5,871,265 A * | 2/1999 | Stewart | ............... | A47B 88/493 312/333 |
| 6,070,742 A * | 6/2000 | McAnally | ............ | H05K 7/1491 361/826 |
| 6,318,824 B1 * | 11/2001 | LaGrotta | ............... | E06B 3/5045 312/322 |
| 7,857,267 B2 * | 12/2010 | Watts | ................... | H05K 7/1489 312/265.2 |
| 9,066,590 B2 * | 6/2015 | Wu | ........................ | H05K 7/183 |
| 10,638,634 B1 * | 4/2020 | Elsasser | ............... | H05K 9/0062 |
| 10,834,842 B1 * | 11/2020 | Elsasser | ................ | H05K 7/183 |
| 2003/0136749 A1 * | 7/2003 | Williams | ............... | A47B 88/43 211/175 |
| 2005/0274680 A1 * | 12/2005 | Allen | .................... | A47B 96/068 211/26 |
| 2008/0135705 A1 * | 6/2008 | Chuang | ................ | H05K 7/1489 248/243 |
| 2014/0021154 A1 * | 1/2014 | Chen | .................... | H05K 7/1489 248/205.1 |
| 2014/0068920 A1 * | 3/2014 | Williams | .................. | F16L 3/00 29/525.01 |

(Continued)

FOREIGN PATENT DOCUMENTS

JP 2011222638 A * 11/2011

*Primary Examiner* — Kimberley S Wright
(74) *Attorney, Agent, or Firm* — NORTH WEBER & BAUGH LLP

(57) ABSTRACT

Traditionally, rail systems for racks that house electronic equipment, such as information handling system only allow motion from one side of the rack, if they allow movement at all. Embodiments presented herein provide mechanisms and methods that allow for motion of information handling systems in a housing from more than just one side of the housing.

20 Claims, 9 Drawing Sheets

(56) References Cited

U.S. PATENT DOCUMENTS

| | | | |
|---|---|---|---|
| 2014/0265793 A1* | 9/2014 | Evans ................. | H05K 7/1489 312/334.44 |
| 2015/0123528 A1* | 5/2015 | Wu ..................... | A47B 88/443 312/319.1 |
| 2015/0181753 A1* | 6/2015 | Murakami ........... | H05K 7/1489 211/162 |
| 2019/0245334 A1* | 8/2019 | Chen ................... | H05K 7/1491 |

* cited by examiner

900

```
┌─────────────────────────────────────────────────┐
│ Given a rail system for an information handling │
│ system in a housing, operates a mechanism that  │─ 905
│ allows movement of the information handling     │
│ system so that it can be accessed from a        │
│ second side                                     │
└─────────────────────────────────────────────────┘
                        │
                        ▼
┌─────────────────────────────────────────────────┐
│ Moving the information handling system on the   │─ 910
│ rail system in a first direction or a second    │
│ direction                                       │
└─────────────────────────────────────────────────┘
```

FIG. 9

MECHANISMS AND METHODS FOR TWO-SIDED RACK ACCESS

BACKGROUND

A. Technical Field

The present disclosure relates generally to housing information handling systems. More particularly, the present disclosure relates to rail systems for housings (or racks) for information handling systems.

B. Background

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use, such as financial transaction processing, airline reservations, enterprise data storage, or global communications. In addition, information handling systems may include a variety of hardware and software components that may be configured to process, store, and communicate information and may include one or more computer systems, data storage systems, and networking systems.

The increased use of information handling systems has resulted in rooms or even entire floors or buildings that house information handling systems. For example, an entity (e.g., a business, education establishment, government, etc.) may have an information technology (IT) room for a limited number of IT equipment or may use a data center, which is a facility for a vast number of information handling systems. In any case, it is quite common to employ some form or housing unit or units to hold the equipment. The most common form of housing unit, particularly for data centers, is a rack system. A rack system allows for the affixing of information handling systems to the rack in an orderly fashion.

The rack systems also typically have two forms of attachment. The first form of attachment is a fixed attachment, which means that, once installed in the rack, the information handling system is not able to move.

The second form of rack attachment is a rail mechanism that allows for the sliding of the information handling system relative to the rack frame. Typically, a rail guide is attached to rack and mating rail is attached to the information handling system. Once installed, the information handling system can be slide in and out of the rack for inspection or for other reasons. However, currently such rail systems only support sliding of the information handling system from one side.

Accordingly, it is highly desirable to have mechanism and methods that allow for motion of information handling systems in housing from more than just one side of the housing.

BRIEF DESCRIPTION OF THE DRAWINGS

References will be made to embodiments of the disclosure, examples of which may be illustrated in the accompanying figures. These figures are intended to be illustrative, not limiting. Although the accompanying disclosure is generally described in the context of these embodiments, it should be understood that it is not intended to limit the scope of the disclosure to these particular embodiments. Items in the figures may not be to scale.

FIG. 9 depicts a method for using a rail system that includes a stop mechanism, according to embodiments of the present disclosure.

DETAILED DESCRIPTION OF EMBODIMENTS

Figure 1:
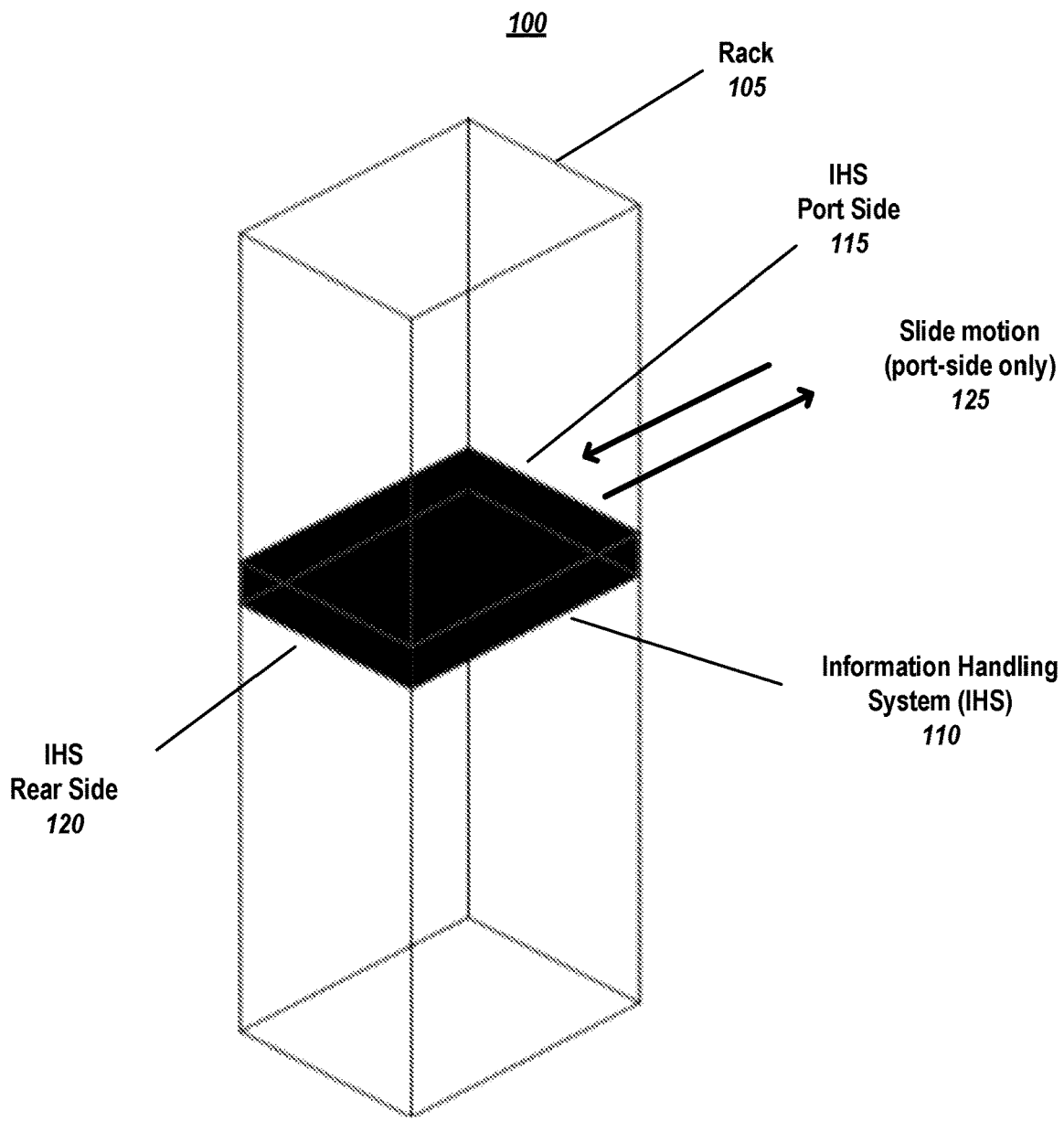
FIG. 1 depicts an example rack system, which includes an information handling system that is housed in the rack.
Figure 1:
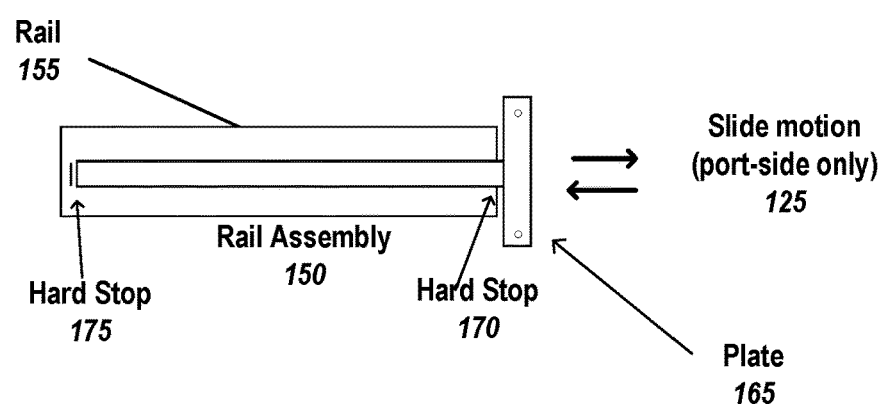

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system/device, or a method on a tangible computer-readable medium.

Components, or modules, shown in diagrams are illustrative of exemplary embodiments of the disclosure and are meant to avoid obscuring the disclosure. It shall also be understood that throughout this discussion that components may be described as separate functional units, which may comprise sub-units, but those skilled in the art will recognize that various components, or portions thereof, may be divided into separate components or may be integrated together, including, for example, being in a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," "communicatively coupled," "interfacing," "interface," or any of their derivatives shall be understood to include direct connections, indirect connections through one or more intermediary devices, and wireless connections. It shall also be noted that any communication, such as a signal, response, reply, acknowledgment, message, query, etc., may comprise one or more exchanges of information.

Reference in the specification to "one or more embodiments," "preferred embodiment," "an embodiment," "embodiments," or the like means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. The terms "include," "including," "comprise," and "comprising" shall be understood to be open terms, and any examples are provided by way of illustration and shall not be used to limit the scope of this disclosure.

A service, function, or resource is not limited to a single service, function, or resource; usage of these terms may refer to a grouping of related services, functions, or resources, which may be distributed or aggregated. The use of memory, database, information base, data store, tables, hardware, cache, and the like may be used herein to refer to system component or components into which information may be entered or otherwise recorded. The terms "data," "information," along with similar terms, may be replaced by other terminologies referring to a group of one or more bits, and may be used interchangeably. The terms "packet" or "frame" shall be understood to mean a group of one or more bits. The term "frame" shall not be interpreted as limiting embodiments of the present invention to Layer 2 networks; and, the term "packet" shall not be interpreted as limiting embodiments of the present invention to Layer 3 networks. The terms "packet," "frame," "data," or "data traffic" may be replaced by other terminologies referring to a group of bits, such as "datagram" or "cell."

It shall be noted that: (1) certain steps may optionally be performed; (2) steps may not be limited to the specific order set forth herein; (3) certain steps may be performed in different orders; and (4) certain steps may be done concurrently.

Any headings used herein are for organizational purposes only and shall not be used to limit the scope of the description or the claims. Each reference/document mentioned in this patent document is incorporated by reference herein in its entirety.

It shall also be noted that although embodiments described herein may be within the context of racks, aspects of the present disclosure are not so limited. Accordingly, the aspects of the present disclosure may be applied or adapted for use in other contexts.

FIG. 1 depicts an example rack system 100, which includes an information handling system 110 that is housed in the rack 105. The information handling system 100 is attached to the rack 105 via a rail assembly 150 that allows the information handling system to slide 125. Note that the slide motion is not bi-directional in terms of sides of the rack 105. That is, the sliding motion is only from the port side 115; the slide motion is not available on the rear side 120 of the information handling system.

This restricted motion is due to the physical mechanics of the rail guide system 150. As noted previously, the rail assembly system 150 comprises a rail guide and a mating rail 155. There are hard stops at both ends 175 and 170 as part of the system 150, which prevent the sliding motion to extend beyond the rack on the rear side.

This one-sided access presents problems. For example, information handling system installation and removal from a rack is in a single direction, typically the port side. To further exacerbate the problem, the port side of the information handling system generally faces the back of the rack. Also, information handling system installation and replacement is challenging in a populated rack due to cables, power units, and/or cable management kits, which cause obstruction. Thus, it would be extremely beneficial if an information handling system could also be inserted, removed, or accessed in the other direction. Two-sided access provides greater flexibility for access and avoids cables and other obstructions.

Figure 2:
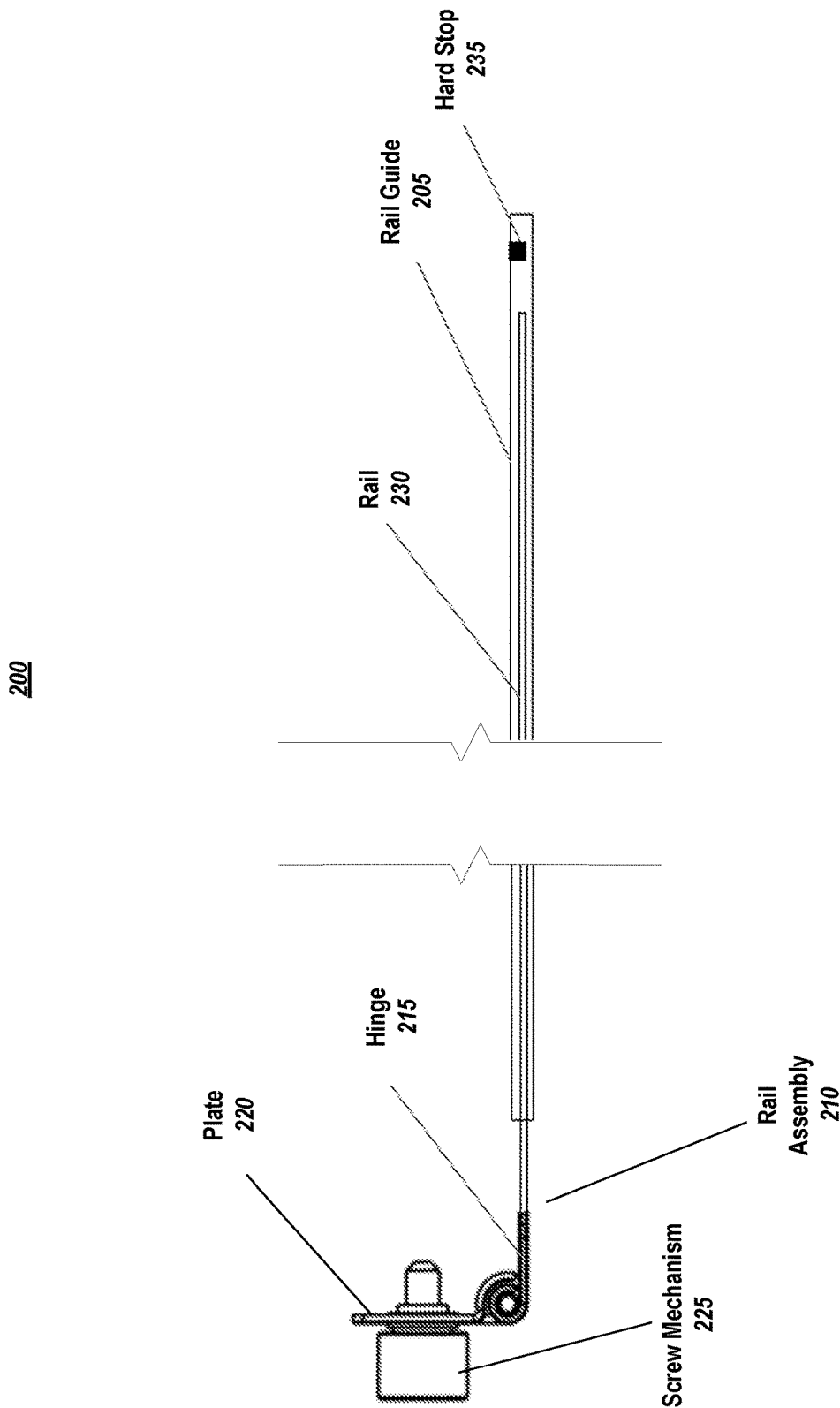
FIG. 2 depicts a top view of a traditional rail assembly system.

FIG. 2 depicts a top view of a traditional rail assembly system 200. The assembly comprises a rail guide 205 that is affixed to the rack and receives a mating rail 230 that is attached to an information handling system and allows lateral movement relative to the rail guide. Also frequently present in rail systems 200 are a screw mechanism 225, which is attached to a plate 220 and hinge 215. This screw mechanism is movable (via the hinge) to be positioned to screw into a mating hole in the rack to affix, if desired, the information handling system so that it does not slide. The location and physical dimensions of the hinge and the hinge and plate stop the slide motion from extending into the rack interior to allow two-sided rack access. Also, the ride system 200 also has a hard stop mechanism 235 that prevents the rail from sliding further in the rail guide.

Figure 3:
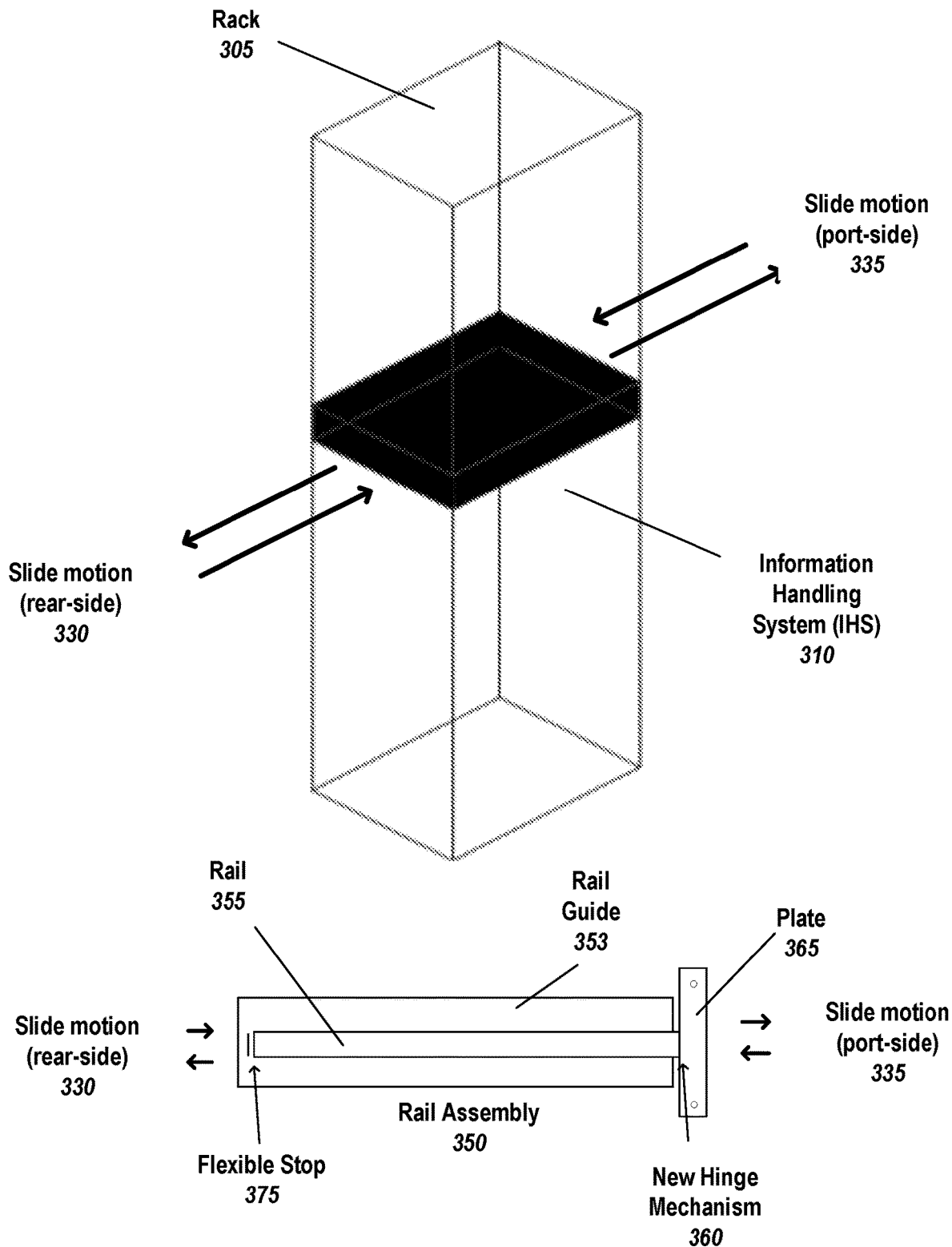
FIG. 3 illustrates the two-sided rack access that is available via embodiments of the present disclosure.

FIG. 3 illustrates the two-sided rack access that is available via embodiments of the present disclosure. As shown, the rack 305 has an information handling system housed in the rack and attached via rail mechanism, according to embodiments of the present disclosure. Note that, unlike traditional rail mechanism, the rail mechanism embodiment 350 allows sliding motion on two sides of the rack 305, the port side 335 and the rear side 330.

A side view of the rail mechanism embodiment 350 is also depicted in FIG. 3. The mechanism 350 comprises a rail guide 353 for attaching to the rack and a mating rail 355 that attaches to an information handling system. Unlike typical rail systems, the embodiment comprises a new hinge mechanism 360 that allows for sliding motion from two sides— port side 335 and the rear side 330—of the rack. Embodiments may also include a flexible stop 375 that allows the rail mechanism to function like a typical one-sided access rail system when the stop is engaged or may function as a two-sided access rail system when the flexible stop is not engaged. Finally, while not depicted in FIG. 3, embodiments may also use a smaller plate 365 to allow two-sided motions.

Figure 4:
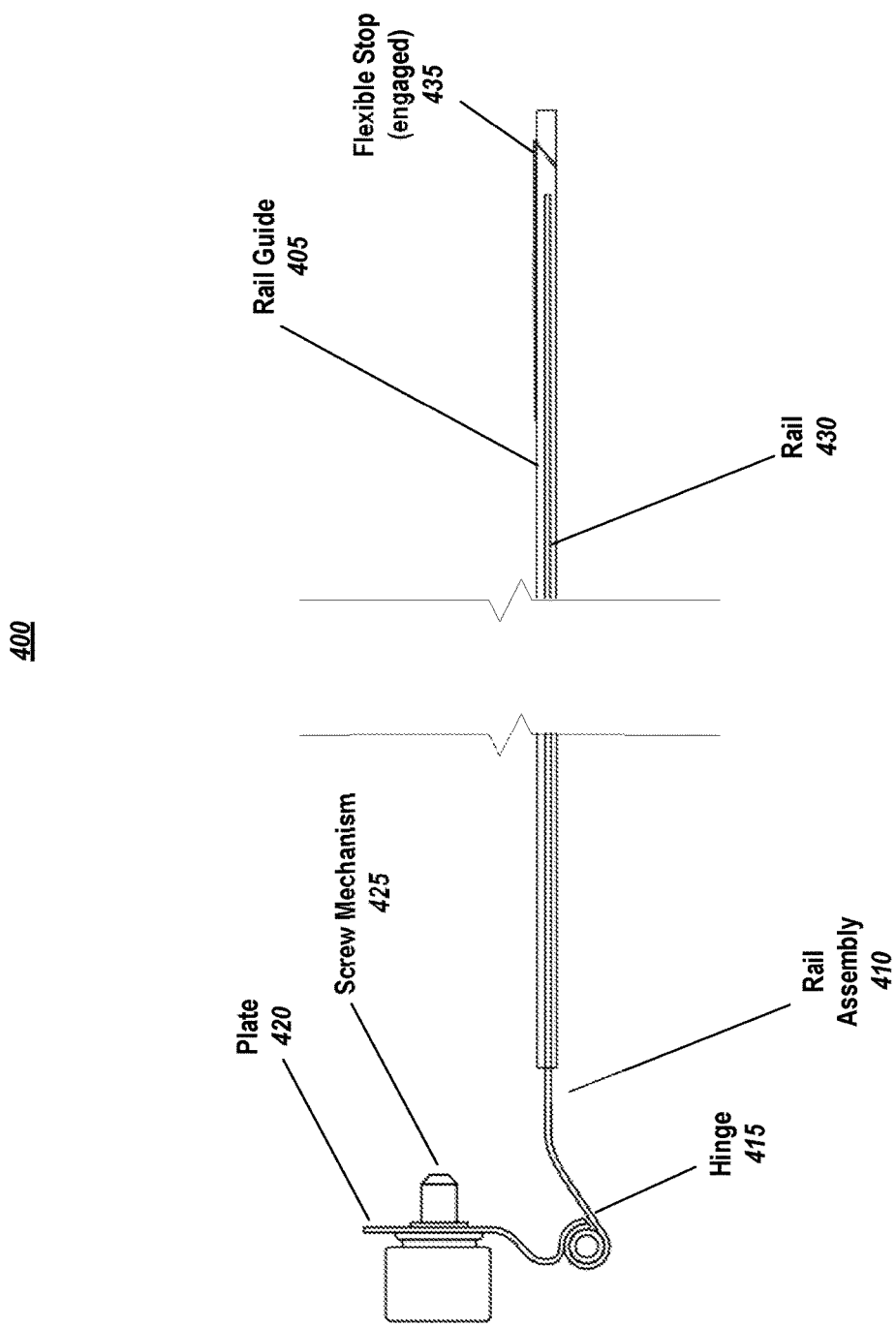
FIG. 4 depicts a top view of a rail mechanism, according to embodiments of the present disclosure.

FIG. 4 depicts a top view of a rail mechanism, according to embodiments of the present disclosure. In the depicted embodiment, the rail assembly system 400 comprises a rail guide 405 for affixing to the rack and that receives a mating rail 430 that designed to be attached to an information handling system and allows lateral movement relative to the rail guide, but the lateral movement is not restricted from one side.

In the depicted embodiment, the rail system 400 comprises a screw mechanism 425, which is attached to a plate 420 and hinge 415. This screw mechanism is movable (via the hinge 415) to be positioned to screw into a mating hole in the rack to affix, if desired, the information handling system so that it does not slide at all. Unlike hinges in prior rail assemblies, this hinge is offset from the rail toward what would be the interior of the rack. Thus, the location and physical dimensions of the hinge allows for the rail to slide into the interior of the rack, thereby not stopping the sliding motion for the opposite side of the rack and allowing two-sided rack access. The depicted example also includes a flexible stop 435, which is shown in the engaged position. In the engaged position, the rail system embodiment 400 operates like a traditional one-sided access rail system.

Figure 5:
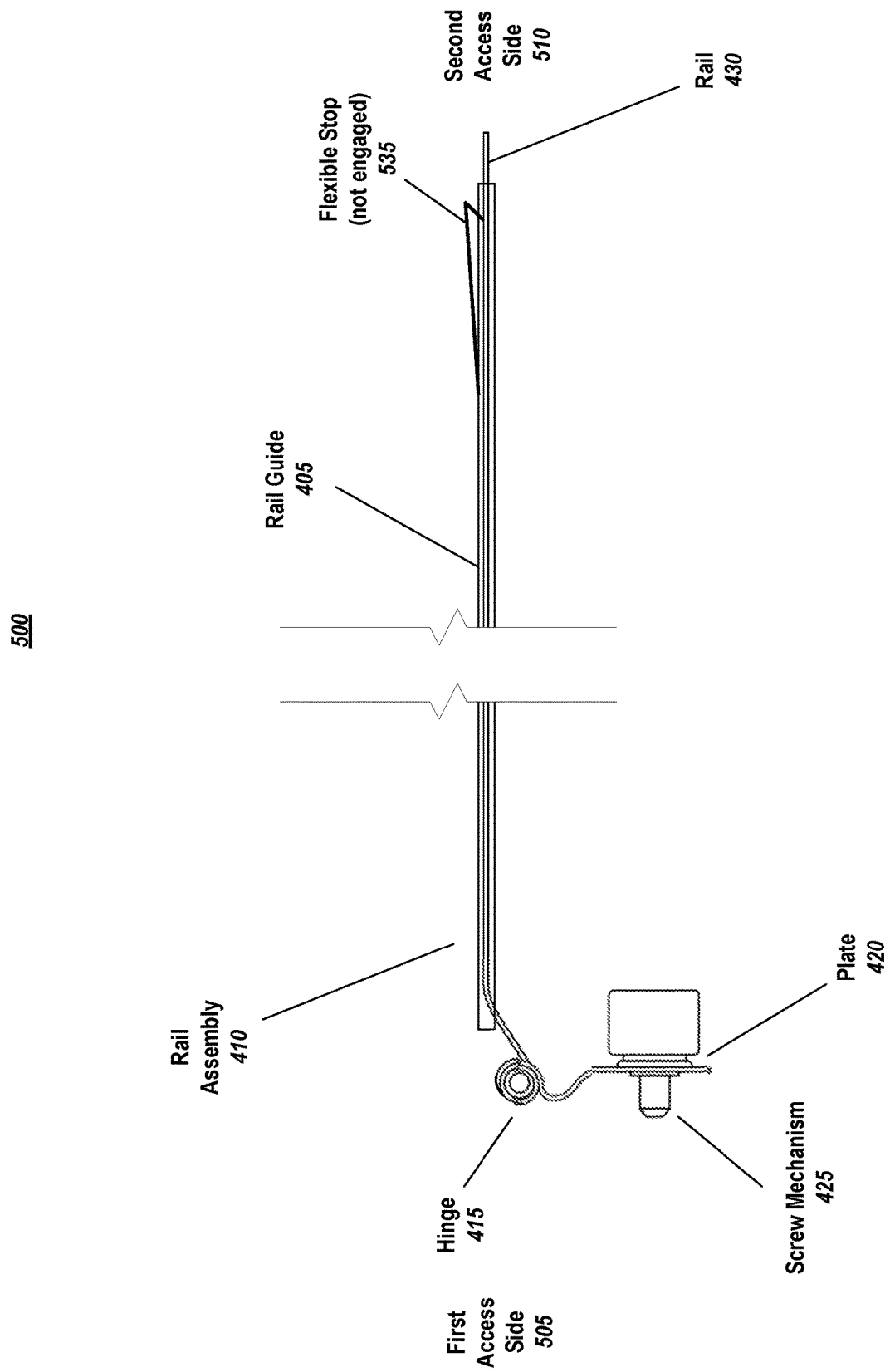
FIG. 5 depicts an alternate arrangement of rail system, according to embodiments of the present disclosure.

FIG. 5 depicts an alternate arrangement of rail system, according to embodiments of the present disclosure. In the depicted embodiment, screw mechanism 425 has been rotated toward what would be the interior of the rack system and the flexible stop 535 is not engaged. Because the flexible stop is not engaged, the rail 430 is able to move past the flexible stop, and an information handling system attached to the rail system can be accessed from the second side 510. Also note that because the hinge 415 is not directly in line with the rail and rail guide, it will clear the rail guide 405 as it moves into the second access side direction 510.

Figure 6:
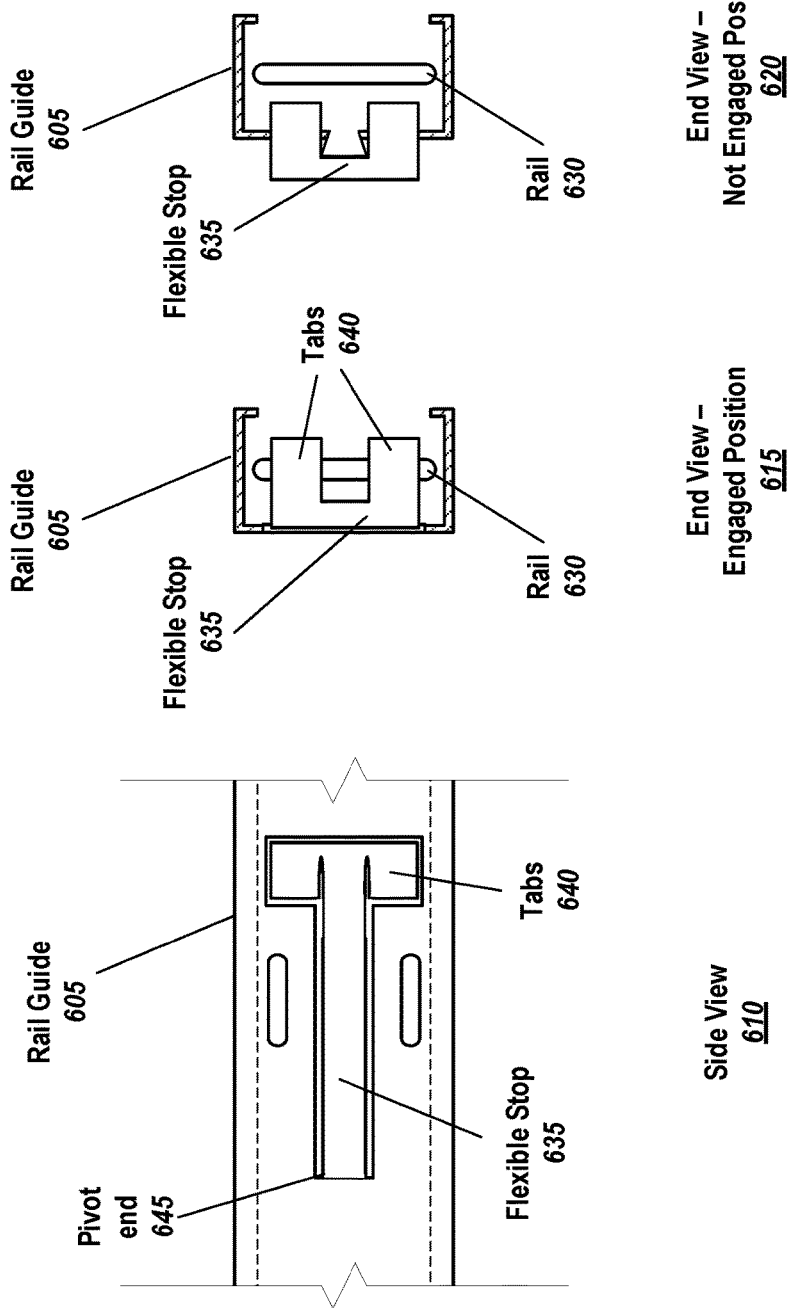
FIG. 6 depicts a flexible stop, according to embodiments of the present disclosure.

FIG. 6 depicts a flexible stop, according to embodiments of the present disclosure. In one or more embodiments, the flexible stop mechanism 635 uses flexible metal with hooked end or tabs 640. In one or more embodiments, the flexible stop mechanism 635 is in the rail guide 605, and the flexible metal provides a spring mechanism or pivot 645 to engage the flexible stop 635. In one or more embodiments, a person's fingers or a tool may be used to disengage the flexible stop from interior of rack. A first end view 615 in FIG. 6 shows the flexible stop mechanism 635 in an engaged position, in which the rail 630 cannot move past the stop. A second end view 620 in FIG. 6 shows the flexible stop mechanism 635 in a not engaged position, in which the rail 630 is able to move past the stop.

Figure 7:
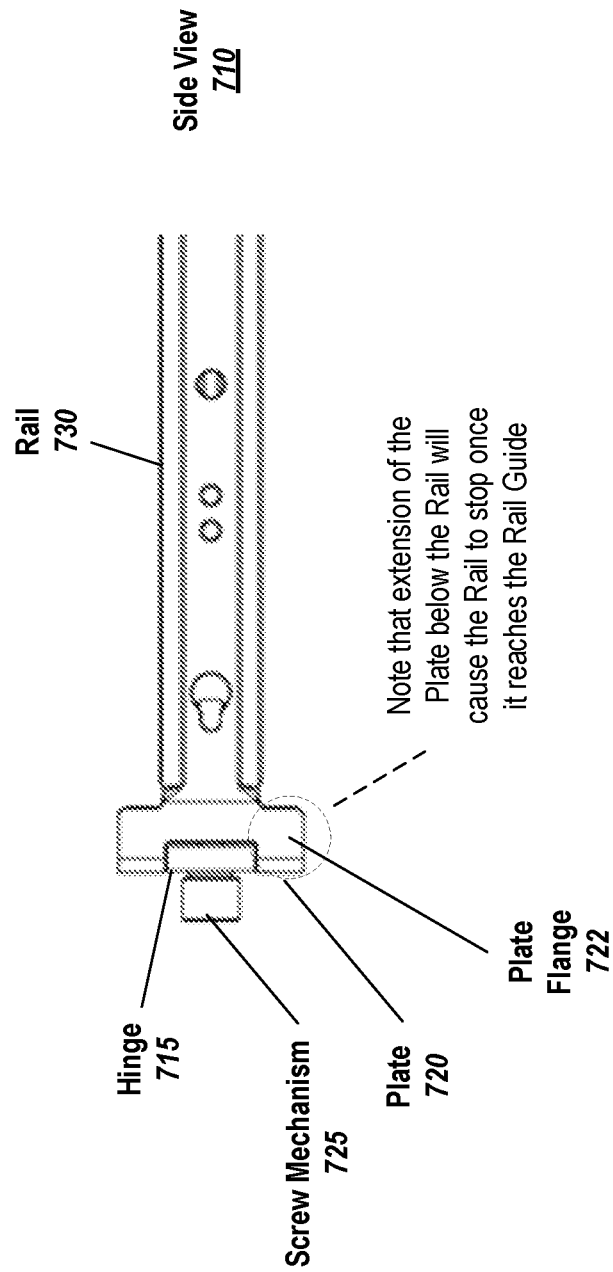
FIG. 7 depicts a side view of a traditional rail for a rail system.
Figure 8:
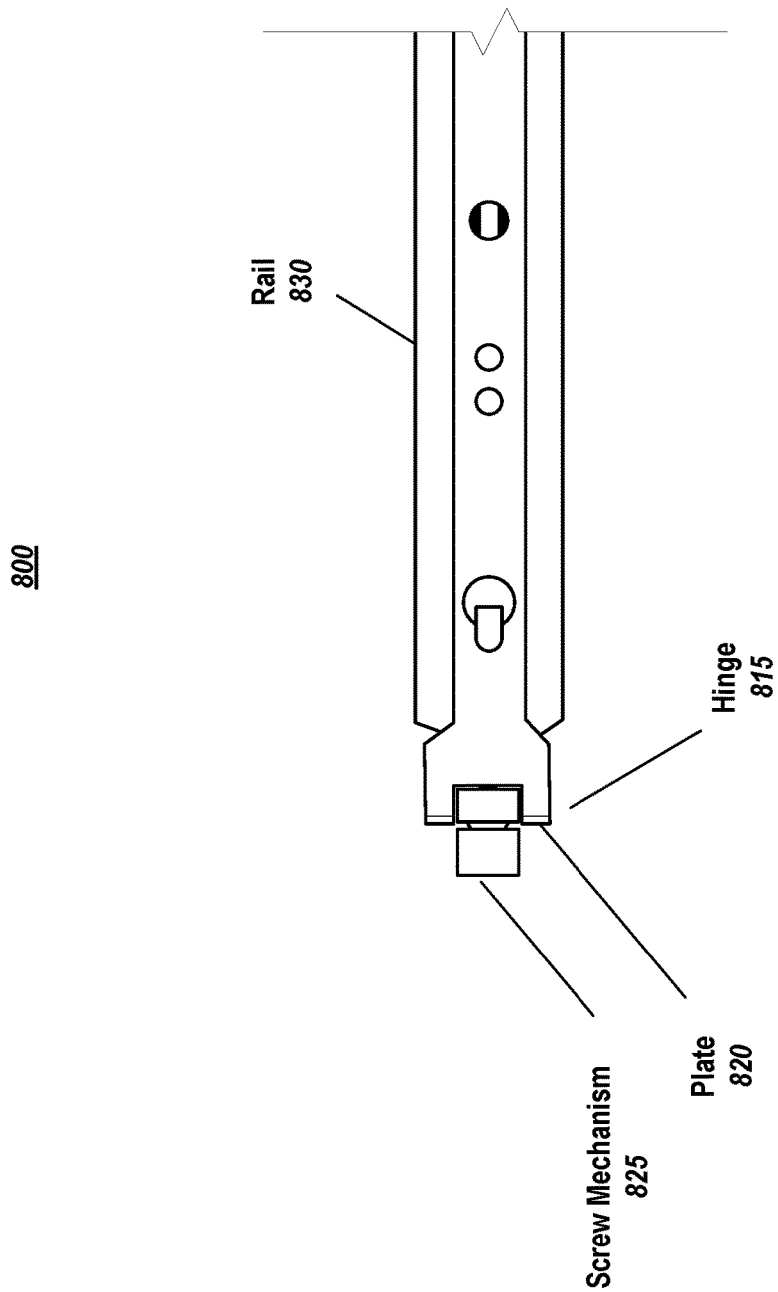
FIG. 8 depicts a side view of a rail, according to embodiments of the present disclosure.

FIG. 7 depicts a side view of a traditional rail 700 for a rail system like that shown in FIG. 2. The rail includes a screw mechanism 725, which is attached to a plate 720 and hinge 715. This screw mechanism is movable (via the hinge) to be positioned to screw into a mating hole in the rack to affix, if desired, to the information handling system so that the attached information handling system does not slide. The location and physical dimensions of the plate causes the rail 700 to stop its slide motion from extending into the rack interior because the plate flange 722 extends below the rail guide (not shown in FIG. 7). In one or more embodiments, a rail may comprise a smaller plate flange so that it does not prohibit two-side access motion. FIG. 8 depicts an example embodiment of such a rail.

FIG. 8 depicts a side view of a rail 800, according to embodiments of the present disclosure. Note that the plate 820—which may hold a same screw mechanism 825 as in the traditional rail (see screw 725 in FIG. 7), a modified screw mechanism, or no screw mechanism at all—has a flange that is small enough to clear the rail guides so that the plate portion can travel into the rail guide and support two-sided rack access. In or more embodiments, particularly if no fastening mechanism, like a screw mechanism is present, there need not be any plate or a substantially reduced one.

Two-sided access provides a number of benefits. For example, such rail system embodiments support bi-directional installation and removal of devices from a rack. Second, such rail system embodiments make information handling system expansion and replacement possible when one of the directions is obstructed (e.g., by cables, PDUs, cable management kits, posts, walls, etc.). Third, embodiments may include a flexible stop mechanism that is accessible from interior of rack and allows for one-sided access and two-sided access. One skilled in the art shall recognize other benefits.

It should be noted that the different features, such as modified hinge positioning, smaller plate flange or no plate, flexible stop, no stop, etc. may be combined into various combinations.

It should also be noted that the rails and rail guides may be used in pairs. For example, in one or more embodiments, a user may attach a first rail to a first side of an information handling system and a second rail to a second side of the information handling system, the second side of the information handling system being opposite the first side of the information handling system. Then, the user may insert the information handling system with the attached first and second rails into mating rail guides that are attached to a rack, in which the information handling system is slidably movable relative to the rail guide in a front direction and a back direction so that the information handling system installed in the rack is slidably movable inward and outward from the rack from a front side of the rack and from a back side of the rack.

FIG. 9 depicts a method for using a rail system that includes a stop mechanism, according to embodiments of the present disclosure. Given a rail system for an information handling system in a housing, a user operates (905) a mechanism that allows movement or access of the information handling system from a second side of the rack. Once the stop is unengaged, the information handling system may be moved (910) on the rail system in a first direction or a second direction. It should be noted that if the rail system does not include a stop, the rail system may be free to move in both directions at will. In yet another embodiment, flexible stop may be a rounded stop that is movable upon a threshold level of force. This threshold level allows an installed information handling system to stop and not easily roll out the rear (and/or front) side, but with sufficient force can be made to move out the rear (and/or front) side.

In one or more embodiments, aspects of the present patent document may be directed to, may include, or may be implemented on one or more information handling systems (or computing systems). An information handling system/computing system may include any instrumentality or aggregate of instrumentalities operable to compute, calculate, determine, classify, process, transmit, receive, retrieve, originate, route, switch, store, display, communicate, manifest, detect, record, reproduce, handle, or utilize any form of information, intelligence, or data. For example, a computing system may be or may include a personal computer (e.g., laptop), tablet computer, mobile device (e.g., personal digital assistant (PDA), smart phone, phablet, tablet, etc.), smart watch, server (e.g., blade server or rack server), a network storage device, camera, or any other suitable device and may vary in size, shape, performance, functionality, and price. The computing system may include random access memory (RAM), one or more processing resources such as a central processing unit (CPU) or hardware or software control logic, read only memory (ROM), and/or other types of memory. Additional components of the computing system may include one or more drives (e.g., hard disk drives, solid state drive, or both), one or more network ports for communicating with external devices as well as various input and output (I/O) devices, such as a keyboard, mouse, stylus, touchscreen, and/or video display. The computing system may also include one or more buses operable to transmit communications between the various hardware components.

One skilled in the art will recognize no particular rack or information handling system is critical to the practice of the present disclosure. One skilled in the art will also recognize that a number of the elements described above may be physically and/or functionally separated into modules and/or sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A rail system comprising:
   a rail guide that is configurable to be attached to a rack for holding an information handling system;
   a rail for insertion into the rail guide and that is slidably movable relative to the rail guide in a first direction and a second direction so that the information handling system connected to the rail and installed in the rack can be slidably moved inward and outward from the rack from a first side of the rack and from a second side of the rack;
   a hinge located at a first end of the rail, the hinge being position offset from an axis of the rail in a direction toward an interior of the rack where the information handling system resides when the rail is in the rail guide attached to the rack; and
   a securing mechanism connected to the hinge, which allows the securing mechanism:
      to be positioned towards an exterior of the rack to be positioned so that the securing mechanism can be secured to the rack thereby securing the information handling system in a fixed position, and
      to be positioned towards the interior of the rack so that the securing mechanism does not prevent the information handling system from being slidably movable in the first and second directions.

2. The rail system of claim 1 wherein:
   the securing mechanism comprises a plate that is sized to clear the rail guide when the securing mechanism is moving toward the rail guide to allow the rail and the securing mechanism to move in the second direction and provide access to the information handling system from the second side of the rack.

3. The rail system of claim 1 wherein the rail guide further comprises:
   a flexible stop to prevent the rail from slidably moving beyond a certain position in at least one of the first or second directions.

4. The rail system of claim 3 wherein:
   the flexible stop is moveable to allow the rail to slidably move beyond the certain position in at least one of the first or second directions so that the information handling system may be accessed by both the first and the second sides of the rack.

5. The rail system of claim 4 wherein:
   the flexible stop is moveable to an unengaged position to allow the rail to slidably move beyond the certain position when the flexible stop is subjected to a force above a threshold amount.

6. The rail system of claim 4 wherein:
   the flexible stop is moveably attached at one end to the rail guide and comprises one or more tabs at or near another end that:
      when in an engaged position, extend into the rail guide and prevent the rail from slidably moving beyond the tabs; and
      when in an unengaged position, do not prevent the rail from slidably moving beyond the one or more tabs' position in at least one of the first or second directions.

7. A rail system comprising:
   a rail mechanism for connecting to an information handling system, in which the rail is configured to mate with a rail guide that is configured to be attached to a rack, the rail mechanism comprising:
      a rail for insertion into the rail guide and that is slidably movable relative to the rail guide in a first direction and a second direction so that the information handling system connected to the rail mechanism and installed in the rack can be slidably moved inward and outward from the rack from a first side of the rack and from a second side of the rack;
      a hinge located at a first end of the rail, the hinge being position offset from an axis of the rail in a direction toward an interior of the rack where the information handling system resides when the rail is in the rail guide attached to the rack; and
      a securing mechanism connected to the hinge, in which the hinge allows the securing mechanism to be positioned towards the interior of the rack so that the securing mechanism does not prevent the information handling system attached to the rail from being slidable.

8. The rail system of claim 7 wherein:
   the securing mechanism, when not secured to the rack, is movable via the hinge in a direction toward the interior of the rack so that the securing mechanism does not prevent the information handling system attached to the rail to be slidably accessed from a side of the rack opposite the side of the rack on which the securing mechanism resides.

9. The rail system of claim 7 wherein:
   the securing mechanism comprises a plate that is sized to clear the rail guide when the securing mechanism moves toward the rail guide to allow the rail to move in the second direction and provide access to the information handling system from the second side of the rack.

10. The rail system of claim 7 further comprising:
    a flexible stop to prevent the rail from slidably moving beyond a certain position in at least one of the first or second directions.

11. The rail system of claim 10 wherein:
    the flexible stop is moveable to allow the rail to slidably move beyond the certain position in at least one of the first or second directions so that the information handling system may be accessed by both the first and the second sides of the rack.

12. The rail system of claim 10 wherein:
    the flexible stop is moveable to an unengaged position to allow the rail to slidably move beyond the certain position when the flexible stop is subjected to a force above a threshold amount.

13. The rail system of claim 10 wherein:

the flexible stop is moveably attached at one end to the rail guide and comprises one or more tabs at or near another end that:
- when in an engaged position, extend into the rail guide and prevent the rail from slidably moving beyond the tabs; and
- when in an unengaged position, do not prevent the rail from slidably moving beyond the one or more tabs' position in at least one of the first or second directions.

14. A method comprising:

attaching a first rail to a first side of an information handling system and a second rail to a second side of the information handling system, the second side of the information handling system being opposite the first side of the information handling system and at least one rail of the first or second rails comprises:
- a hinge located at a first end of the rail, the hinge being position offset from an axis of the rail in a direction toward an interior of a rack where the information handling system resides when in the rack; and
- a securing mechanism connected to the hinge, in which the hinge allows the securing mechanism to be positioned towards the interior of the rack so that the securing mechanism does not prevent the information handling system attached to the rail from being slidable; and inserting the information handling system with the attached first and second rails into mating rail guides that are attached to a rack, in which the information handling system is slidably movable relative to the rail guide in a front direction and a back direction so that the information handling system installed in the rack is slidably movable inward and outward from the rack from a front side of the rack and from a back side of the rack.

15. The method of claim 14 wherein:
- at least one of the rail guides further comprises a flexible stop to prevent its corresponding rail from slidably moving beyond a certain position; and
- wherein the method of claim 14 further comprises:
  - affecting the flexible stop to allow movement of the information handling system in a secondary direction.

16. The method of claim 15 wherein the step of affecting the flexible stop to allow movement of the information handling system in a secondary direction comprises:
subjecting the flexible stop to a force above a threshold amount.

17. The rail system of claim 7 wherein the hinge allows the securing mechanism to be rotated toward an exterior of the rack to facilitate securing the securing mechanism to the rack.

18. The method of claim 14 further comprising:
- positioning the securing mechanism, via the hinge, toward an exterior of the rack; and
- affixing the securing mechanism to the rack to limit movement of the information handling system.

19. The method of claim 14 further comprising:
- positioning the securing mechanism, via the hinge, in the interior of the rack so that the securing mechanism does not prevent the information handling system attached to the rail from being slidably accessed in the front direction or the back direction.

20. The method of claim 14 wherein the securing mechanism comprises a plate portion that is sized to clear the rail guide when the securing mechanism moves toward the rail guide to allow the rail to move in the rail guide in either direction.

* * * * *